United States Patent [19]

Ishii et al.

[11] Patent Number: 5,075,757
[45] Date of Patent: Dec. 24, 1991

[54] OHMIC CONTACT ELECTRODES FOR SEMICONDUCTOR DIAMONDS

[75] Inventors: Masayuki Ishii; Tunenobu Kimoto; Shoji Nakagama; Tadashi Tomikawa; Nobuhiko Fujita, all of Itami, Japan

[73] Assignee: Sumitomo Electric Industries, Ltd., Osaka, Japan

[21] Appl. No.: 556,722

[22] Filed: Jul. 25, 1990

[30] Foreign Application Priority Data

Jul. 26, 1989 [JP] Japan .................................. 1-193607

[51] Int. Cl.⁵ ............................................. H01L 23/54
[52] U.S. Cl. ........................................ 357/67; 357/59; 357/2
[58] Field of Search ..................... 357/2, 4, 6, 59, 67, 357/61, 15; 437/173, 175, 187

[56] References Cited

U.S. PATENT DOCUMENTS 4,972,250 11/1990 Omori et al. ............................ 357/2
4,982,243 1/1991 Nakahata et al. ....................... 357/15
5,002,899 3/1991 Geis et al. ............................... 357/15

FOREIGN PATENT DOCUMENTS 58-145134 11/1983 Japan .

OTHER PUBLICATIONS

Moazed et al, "Ohmic Contacts to Semiconductor Diamond", IEEE Electron Device Letters, vol. 9, No. 7, Jul. 1988.

Primary Examiner—Rolf Hille
Assistant Examiner—S. V. Clark
Attorney, Agent, or Firm—Cushman, Darby & Cushman

[57] ABSTRACT

As electrodes for the semiconductor diamond, the p+ or n+ polycrystalline silicon film or amorphous silicon film including microcrystalline silicon phase is formed on the semiconductor diamond, whereby an ohmic contact electrode with low contact resistance can be made.

9 Claims, 1 Drawing Sheet

OHMIC CONTACT ELECTRODES FOR SEMICONDUCTOR DIAMONDS

BACKGROUND OF THE INVENTION

1. Field of the Invention

This invention relates to ohmic contact electrodes for semiconductor diamonds such as diodes, transistors and sensors.

2. Description of the Prior Art

The semiconductor diamond is now drawing an industrial attention as a new material for semiconductor devices such as diodes, transistors, sensors, or the like.

Although the diamond is widely known as an insulating substance, the one discussed herein is the semiconductor diamond having a low resistivity.

The diamond has a wide forbidden band gap (5.5 eV) as well as a large carrier mobility (2000 $cm^2/Vs$), and is stable thermally and chemically.

The diamond is normally an insulator, but may be made as the semiconductor of relatively low resistance by doping impurities.

For these reasons, the semiconductor diamond is keenly expected as a material for environmentally withstanding, high-frequency, high-power and or blue light emitting devices.

The semiconductor diamond is available in the forms of a natural bulk, a high-pressure synthetic bulk, and a vapor-phase synthetic film.

The p-type diamond can be obtained by doping boron (B).

On the other hand, the n-type diamond, though it may be obtained by doping phosphorus (P) and lithium (Li), has a high resistivity. And an n-type diamond with a low resistivity has not yet been developed.

Although bipolar devices are not involved, the devices that have already come out in prototypes on the basis of the semiconductor diamond include at present Schottky diodes, making use of Schottky junction with tungsten (W) and a p-type diamond, and several types of unipolar transistors.

In manufacturing semiconductor devices, it is extremely important to form such electrodes that allow ohmic contact. The contact electrodes of anodes and cathodes of light emitting devices or source and drain electrodes of field effect transistors must be ohmic contact electrodes. The ohmic contact electrode means an electrode the current-voltage characteristics through which is symmetric between the forward and backward directions in accordance with the Ohm's law. Moreover, it is strongly desired that the resistance thereof be low. It is common knowledge that an electrode capable of ohmic contact can be obtained by forming some metals such as Ti, AuTi, and AuTa through the method of metallizing on a p-type diamond.

The technique of forming ohmic contacts is an important technique in manufacturing semiconductor devices.

However, the ohmic contact now available to semiconductor diamonds using Ti, AuTa, and the like involve a too large contact resistance as much as 1 $\Omega cm^2$ or more.

In any device manufactured using the conventional ohmic contact with the semiconductor diamond, even if a voltage is applied to, there occurs a remarkable voltage drop across such an ohmic contact region. This results in a unneglible voltage drop of an effective voltage applied to the device, whereby good characteristics of the semiconductor diamond contact can not be sufficiently utilized. Furthermore, the device suffers from a serious drawback that heat is generated at the ohmic contact region.

In manufacturing any electronic devices, contact resistances less than $10^{-4} \Omega cm^2$ are desirable for that of ohmic contacts, and far lower contact resistances are demanded for high-speed, high-frequency devices.

To enable the semiconductor diamond to be utilized as a material for semiconductor devices, a low-resistance ohmic contact is essential.

SUMMARY OF THE INVENTION

An essential object of the present invention is therefore to provide a p-type or n-type semiconductor diamond ohmic contact electrode having a low contact resistance.

In order to accomplish the above object, there is provided an ohmic contact electrode for the semiconductor diamond in accordance with this invention is such that the electrode is formed of p+ or n+ polycrystalline silicon film or amorphous silicon film including microcrystalline silicon phase.

The polycrystalline silicon film may be formed by various known methods such as LPCVD, plasma enhancement CVD (PECVD), molecular beam epitaxy (MBE).

The amorphous silicon film including microcrystalline silicon phase may be formed by plasma CVD method for example.

Preferably, the silicon film electrode including the polycrystalline silicon film or amorphous silicon film including microcrystalline silicon phase is annealed after the electrode is formed.

In the structure mentioned above, since the working function of the diamond is large, there may be formed a high barrier in the contact between the semiconductor diamond and the metal or the metallic compound. Accordingly, a low ohmic contact may not be obtained by merely attaching the metal or metallic compound on the surface of the diamond, even if an ohmic contact is formed the contact resistance may be too high.

However, according to the present invention, by forming the polycrystalline silicon film of p+ or n+ or amorphous silicon film of p+ or n+ including microcrystalline silicon phase as the electrodes on the semiconductor diamond, there can be formed the ohmic contact electrodes with sufficiently low contact resistance.

The above features and advantage have been found by the inventors of the present invention through various experiments, it has not yet been clarified why the structure mentioned above serves to obtain a low contact resistance, but it may be deducted as follows.

(1)-1 In a case where p+ polycrystalline silicon film or p+ amorphus silicon film including microcrystalline silicon phase is formed on the p-type semiconductor diamond, since the work function of the p+ polycrystalline silicon and p+ microcrystalline silicon is large, the barrier becomes low for the p-type semiconductor diamond, whereby there is formed the ohmic contact electrode.

(1)-2 In a case where n+ polycrystalline silicon film or n+ amorphous silicon film including microcrystalline silicon phase is formed on the n-type semiconductor diamond, since the work function of the n+ polycrystalline silicon and n+ amorphous silicon including microcrystalline silicon phase is small, the barrier becomes low for the n-type semiconductor diamond, whereby there is formed the ohmic contact electrode.

(2) When the p+ polycrystalline silicon or p+ amorphous silicon film including microcrystalline silicon phase is formed, there are developed many recombination centers at the interface between the semiconductor diamond and the p+ polycrystalline silicon or p+ amorphous silicon including microcrystalline silicon phase, there is formed the ohmic contact electrode by the recombination centers.

(3) In the surface of the semiconductor diamond which contacts with the p+ polycrystalline silicon or p+ amorphous silicon including microcrystalline silicon phase, there is formed a layer highly doped due to the diffusion during formation of the electrode, whereby the Schottky barrier becomes thin, electrons or holes can pass the depletion layer, and the current can easily flow. There is formed the ohmic contact electrode.

DETAILED DESCRIPTION OF THE PREFERRED EMBODIMENTS

Embodiment 1 (p-type diamond)

Figure 1:
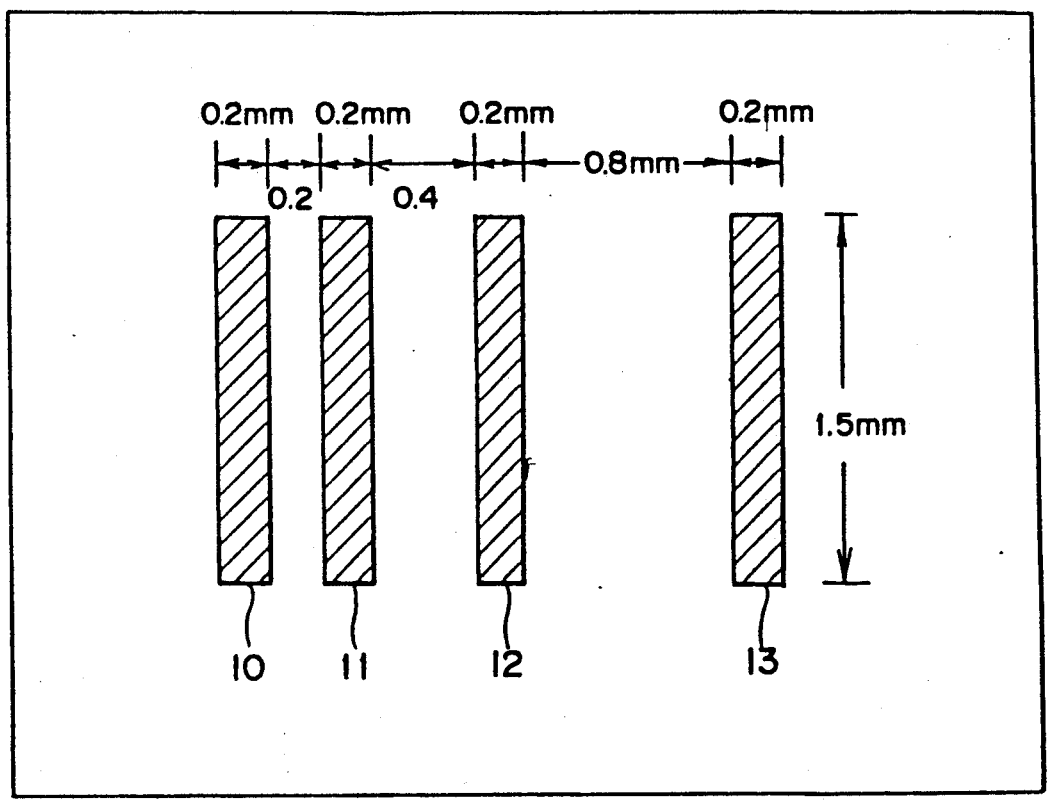
FIG. 1 is a plan view of the electrode patterns used in the embodiments of the present invention to determine the contact resistances between the semiconductor diamond and electrodes, where the shaded portions show the electrodes.

Now the method of electrode formation in accordance with the invention will be described more specifically by way of embodiments thereof.

Several electrodes were formed in accordance with the method of the present invention on the following four types of diamonds, then the contact resistance and ohmic characteristics of the respective electrodes were measured.

a: Natural II$_b$ type of diamond (P-type with Boron doped.)

b: High-pressure synthetic II$_b$ type of diamond c: B-doped p-type thin film type of diamond subjected to a homo-epitaxially grown in the way of vapor-phase synthesis on a high-pressure synthetic I$_b$ type of diamond substrate.

d: P (phosphorus) doped n-type thin film type of diamond homo-epitaxially grown in the way of vapor-phase synthesis on a high-pressure synthetic I$_b$ type of diamond substrate.

Among them, the vapor-phase synthetic thin film was formed using CH$_4$, H$_2$, and B$_2$H$_6$ or PH$_3$ gases by the microwave plasma CVD method.

The electrodes were formed by vacuum evaporation or sputtering method.

The contact resistance between the electrode and the semiconductor diamond were obtained in such a manner as described below.

On this experiment, the electrode patterns as shown in FIG. 1 were formed on the diamonds using a metal mask. Four electrodes 10, 11, 12 and 13 were formed, each one 1.5 mm long by 0.2 mm wide, in parallel with each other and spaced at the intervals of 0.2 mm, 0.4 mm and 0.8 mm.

The ohmic resistances of the electrodes were measured.

The contact resistances of the electrodes were determined using Transmission Line Model based on the resistances between two electrodes and the electrode intervals thereof.

The three types of diamonds (a) to (c) before described were used here. The electrodes were I B doped p-type polycrystalline silicon film of 0.2 micrometers with resistivity of $0.5 \times 10^{-1}$ Ωcm, formed by LPCVD using SiH$_4$ gas and B$_2$H$_6$ gas with a substrate temperature of 600° C.

II B doped p-type amorphous silicon film of 0.2 micrometers with resistivity of 1 Ωcm, which includes microcrystalline silicon phase, formed by plasma CVD using SiH$_4$ gas and B$_2$H$_6$ gas with a substrate temperature of 150° C.

The result of the measurement is shown in Table 1.

TABLE 1

| | Types of Diamonds vs. Contact Resistance of Electrodes | | | | | |
|---|---|---|---|---|---|---|
| | Diamond | | | | | Current- |
| Sample No. | Type | Conduction type | Resistivity (Ω cm) | Thickness (μm) | Kind of electrode | voltage characteristics | Contact resistance (Ω cm$^2$) |
| 1 | Natural | p | $2 \times 10^2$ | 500 | p-polySi | Ohmic | $7 \times 10^{-3}$ |
| 2 | High-pressure synthetic | p | $5 \times 10$ | 500 | p-polySi | Ohmic | $8 \times 10^{-4}$ |
| 3 | Vapor-phase synthetic | p | $2 \times 10^2$ | 2 | p-polySi | Ohmic | $7 \times 10^{-4}$ |
| 4 | Natural | p | $2 \times 10^2$ | 500 | p-μc-Si | Ohmic | $8 \times 10^{-3}$ |
| 5 | High-pressure synthetic | p | $5 \times 10$ | 500 | p-μc-Si | Ohmic | $7 \times 10^{-4}$ |
| 6 | Vapor-phase synthetic | p | $2 \times 10^2$ | 2 | p-μc-Si | Ohmic | $7 \times 10^{-4}$ |
| 7 | Vapor-phase synthetic | p | $3 \times 10^{-1}$ | 2 | p-μc-Si | Ohmic | $4 \times 10^{-5}$ |

Note:
p-polySi: p-type polycrystalline silicon film
p-μc-Si: p-type amorphous silicon film including microcrystalline silicon phase As is understood from Table 1, the B doped p-type polycrystalline silicon film and p-type amorphous silicon film including microcrystalline silicon phase have proved to be ohmic to any one of the three types of diamonds, wherein the contact resistances thereof have resulted in values of the order of $10^{-3}$ to $10^{-5}$ Ωcm$^2$, 2 to 5 orders of magnitude lower than their conventional counterparts.

It may be effective to add annealing to an adequate degree after the electrodes are formed. By the anneal, the contact resistance can be decreased. Although the temperature and time duration for annealing differ in their optimum values depending on the electrode materials used, it is desired to anneal under a temperature of approximately 600° C. to 1000° C. in the innert gas ($N_2$ or Ar), $H_2$ gas or vacuum.

It is noted that a long time anneal is not desired for the amorphous silicon film including the microcrystalline silicon phase because there occur crystalization but increase defects.

Embodiment 2 (n-type diamond)

The ohmic contact electrodes according to the present invention can be applied to the n-type diamond.

The ohmic contact electrodes according to the present invention can be applied to the n-type diamond.

There were formed polycrystalline silicon film electrodes, and the amorphous silicon film electrodes including microcrystalline silicon phase on the n-type diamond film of (d) and the contact resistances thereof were measured. The electrode were I P (phosphorous) doped n-type polycrystalline silicon film of 0.2 micrometers with resistivity of $10^0$ $\Omega$cm, formed by LPCVD using $SiH_4$ gas and $PH_3$ gas with a substrate temperature of 650° C.

II n-type amorphous silicon film of 0.2 micrometers with resistivity of 1 $\Omega$cm which includes microcrystalline silicon phase, formed by plasma CVD using $SiH_4$ gas and $PH_3$ gas with a substrate temperature of 300° C.

The results of the measurement are shown in Table 2.

TABLE 2

Types of Diamonds vs. Contact Resistance of Electrodes

| Sample No. | Diamond | | | | Kind of electrode | Current-voltage characteristics | Contact resistance ($\Omega$ $cm^2$) |
|---|---|---|---|---|---|---|---|
| | Type | Conduction type | Resistivity ($\Omega$ cm) | Thickness ($\mu$m) | | | |
| 8 | Vapor-phase synthetic | n | $7 \times 10^3$ | 2 | n-polySi | Ohmic | $8 \times 10^{-3}$ |
| 9 | Vapor-phase synthetic | n | $7 \times 10^3$ | 2 | n-$\mu$c-Si | Ohmic | $5 \times 10^{-3}$ |

Note:
n-polySi: n-type polycrystalline silicon film
n-$\mu$c-Si: n-type amorphous silicon film including microcrystalline silicon phase As is understood from Table 2, the P doped n-type polycrystalline silicon film and n-type amorphous silicon film including microcrystalline silicon phase have proved to be ohmic to n type diamonds, wherein the contact resistances thereof have resulted in values of the order of $10^{-3}$ $\Omega cm^2$, which is lower than their conventional counterparts.

It may be effective to add annealing to an adequate degree after the electrodes are formed. By the anneal, the contact resistance can be decreased.

It is noted that the p type or n type of the polycrystalline silicon film and the amorphous silicon film including microcrystalline silicon phase used as the electrode material can take various resistivity depending on the doping amount of B or P and the film forming temperature, that is the film forming condition and the anneal condition.

For any types of the diamond, in order to obtain the ohmic contact with low contact resistance, it is desired to select the film forming condition and anneal condition so that the resistance of the electrodes is less than $10^0$ $\Omega$cm.

The polycrystalline silicon film may be formed by the plasma enhancement CVD method (PECVD) method which is easy to form a smooth surface.

There may be used the polycrystalline silicon which is formed by vaporing the dopants and silicon using the molecular beam epitaxy (MBE) method.

As mentioned above, in the present invention, as the electrodes for the semiconductor diamond, the p+ or n+ polycrystalline silicon film or amorphous silicon film including microcrystalline silicon phase is formed on the semiconductor diamond, whereby an ohmic contact electrode with low contact resistance can be made.

The art of forming the ohmic contact electrodes is indispensable in manufacturing the semiconductor diamond devices, therefore, the electrodes according to the present invention are effective in forming any types of electronic devices.

What is claimed is:

1. An ohmic contact electrode for a semiconductor diamond, comprising a p+ or n+ polycrystalline silicon film or amorphous silicon film including microcrystalline silicon phase.

2. The ohmic contact electrode according to claim 1, wherein the polycrystalline silicon film is formed by B doped polycrystalline silicon film.

3. The ohmic contact electrode according to claim 1, wherein the polycrystalline silicon film is formed by P (phosphorous) doped polycrystalline silicon film.

4. The ohmic contact electrode according to claim 1, wherein the polycrystalline silicon is formed by LPCVD method.

5. The ohmic contact electrode according to claim 1, wherein the amorphous silicon film including the microcrystalline silicon film phase is formed by B doped amorphous silicon film.

6. The ohmic contact electrode according to claim 1, wherein the amorphous silicon including the microcrystalline silicon phase is formed by P doped amorphous silicon film.

7. The ohmic contact electrode according to any one of the claim 1, 5 or 6, wherein the amorphous silicon film including the microcrystalline silicon phase is formed by plasma CVD method.

8. The ohmic contact electrode according to any one of claim 1, wherein the electrode is annealed after the electrode is formed in inert gas, $H_2$ gas or vacuum at the temperature of 600° C. to 1,000° C.

9. The ohmic contact electrode according to any one of claim 1, wherein the resistivity of the electrode is less than $10^0$ $\Omega$cm inclusive.

* * * * *